US010181455B2

(12) United States Patent
Zhai et al.

(10) Patent No.: US 10,181,455 B2
(45) Date of Patent: Jan. 15, 2019

(54) 3D THIN PROFILE PRE-STACKING ARCHITECTURE USING RECONSTITUTION METHOD

(71) Applicant: Apple Inc., Cupertino, CA (US)

(72) Inventors: Jun Zhai, Cupertino, CA (US); Chonghua Zhong, Cupertino, CA (US); Kunzhong Hu, Cupertino, CA (US); Se Young Yang, San Jose, CA (US)

(73) Assignee: Apple Inc., Cupertino, CA (US)

(*) Notice: Subject to any disclaimer, the term of this patent is extended or adjusted under 35 U.S.C. 154(b) by 11 days.

(21) Appl. No.: 15/408,263

(22) Filed: Jan. 17, 2017

(65) Prior Publication Data

US 2018/0204820 A1 Jul. 19, 2018

(51) Int. Cl.

*H01L 21/48* (2006.01)
*H01L 25/065* (2006.01)
*H01L 23/00* (2006.01)
*H01L 23/498* (2006.01)
*H01L 23/31* (2006.01)

(Continued)

(52) U.S. Cl.

CPC ...... *H01L 25/0657* (2013.01); *H01L 21/4857* (2013.01); *H01L 21/563* (2013.01); *H01L 21/565* (2013.01); *H01L 21/6835* (2013.01); *H01L 21/76885* (2013.01); *H01L 21/78* (2013.01); *H01L 23/3128* (2013.01); *H01L 23/3135* (2013.01); *H01L 23/3142* (2013.01); *H01L 23/49822* (2013.01); *H01L 23/49827* (2013.01); *H01L 23/49838* (2013.01); *H01L 24/17* (2013.01); *H01L 24/97* (2013.01); *H01L 25/18* (2013.01); *H01L 25/50* (2013.01); *G11C 14/0018* (2013.01); *H01L 2221/68359* (2013.01); *H01L 2224/16225* (2013.01); *H01L 2224/48091* (2013.01); *H01L 2224/48106* (2013.01); *H01L 2224/48225* (2013.01); *H01L 2225/0651* (2013.01); *H01L 2225/06517* (2013.01); *H01L 2225/06548* (2013.01); *H01L 2225/06572* (2013.01); *H01L 2225/06586* (2013.01); *H01L 2924/01022* (2013.01); *H01L 2924/01028* (2013.01); *H01L 2924/01029* (2013.01); *H01L 2924/01079* (2013.01); *H01L 2924/1436* (2013.01);

(Continued)

(58) Field of Classification Search

CPC ......... H01L 25/50; H01L 25/18; H01L 25/06; H01L 25/065; H01L 25/0657; H01L 24/97; H01L 24/17; H01L 21/48; H01L 21/485; H01L 21/4857; H01L 21/56; H01L 21/565; H01L 21/76; H01L 21/768

USPC .......................................................... 257/737

See application file for complete search history.

(56) References Cited

U.S. PATENT DOCUMENTS 9,252,065 B2 2/2016 Lin et al.
2016/0104694 A1 4/2016 Liao et al.

(Continued)

*Primary Examiner* — Monica D Harrison

(74) *Attorney, Agent, or Firm* — Jaffery Watson Mendonsa & Hamilton LLC

(57) ABSTRACT

Package on package structures and methods of manufacture are described. In various embodiments, DRAM die are integrated into various locations within a package on package structure, including within a bottom logic die package, as a co-package with a top NAND die package, and as a hybrid package structure between a top NAND die package and a bottom logic die package.

19 Claims, 14 Drawing Sheets

(51) Int. Cl.
*H01L 25/18* (2006.01)
*H01L 21/56* (2006.01)
*H01L 25/00* (2006.01)
*H01L 21/768* (2006.01)
*H01L 21/683* (2006.01)
*H01L 21/78* (2006.01)
*G11C 14/00* (2006.01)

(52) U.S. Cl.
CPC ................. *H01L 2924/1438* (2013.01); *H01L 2924/1443* (2013.01); *H01L 2924/15311* (2013.01)

(56) References Cited

U.S. PATENT DOCUMENTS

2016/0315071 A1 10/2016 Zhai et al.
2017/0117263 A1* 4/2017 Yeh ....................... H01L 21/486
2017/0141080 A1* 5/2017 Chen ................... H01L 25/0657
2017/0365587 A1* 12/2017 Hung .................... H01L 25/105

* cited by examiner

3D THIN PROFILE PRE-STACKING ARCHITECTURE USING RECONSTITUTION METHOD

BACKGROUND

Field

Embodiments described herein relate to semiconductor packaging. More particularly, embodiments related to package on package structure and methods of manufacture.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die packaging solutions such as system in package (SiP) and package on package (PoP) have become more popular to meet the demand for higher die/component density devices. In one implementation, memory die or packages such as dynamic random-access memory (DRAM) which is generally considered a volatile memory, and/or non-volatile memory die or package, such as flash (e.g. NAND), are stacked on top of a logic die or package (e.g., application-specific integrated circuit (ASIC)) or system on chip (SoC). As the market for portable and mobile electronic devices advances larger memory capability is required of the memory die or package. In one implementation, multiple memory die are stacked vertically to increase the memory in a top memory die package.

SUMMARY

Vertically stacked die package on package structures and methods of fabrication are described. In specific embodiments, the vertically stacked structures may include a logic die (e.g. SoC or ASIC), volatile-memory die (e.g. DRAM), and non-volatile memory die (e.g. NAND). More specifically embodiments describe top NAND die packages bonded to bottom logic die packages, though embodiments are not limited to these specific types of die. Additional DRAM die may be incorporated into the PoP structure in various locations, including within the bottom logic die package, as a co-package with the top NAND die package, and as a hybrid package structure between the top NAND die package and the bottom logic die package.

DETAILED DESCRIPTION

Figure 1:
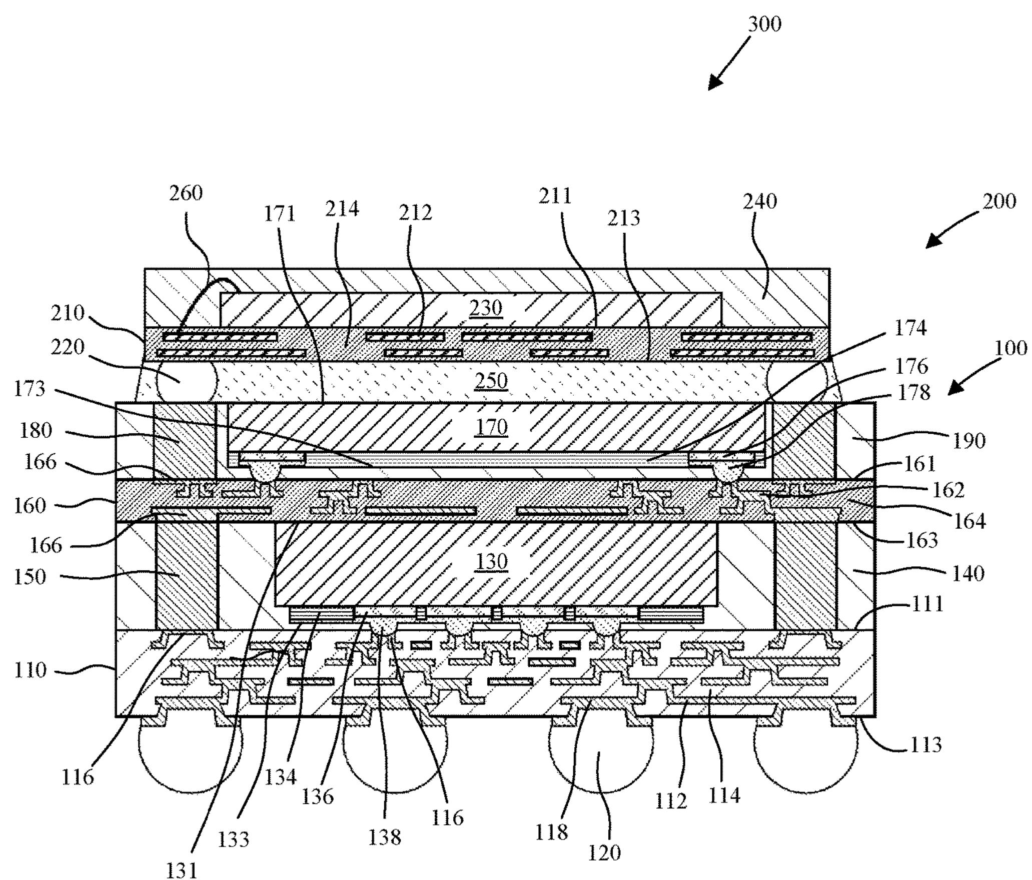
FIG. 1 is a schematic cross-sectional side view illustration of a package on package structure including a top memory package in accordance with an embodiment.

Embodiments describe vertically stacked package structures and methods of fabrication. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

In one aspect, embodiments describe vertically stacked package structures that can be utilized to save space and provide flexibility to an underlying circuit board design. In specific embodiments, the vertically stacked structures may include a logic die (e.g. SoC or ASIC), volatile-memory die (e.g. DRAM), and non-volatile memory die (e.g. NAND), and do not require additional circuit board space for routing between adjacent die. More specifically embodiments describe top NAND die packages bonded to bottom logic die packages, though embodiments are not limited to these specific types of die. Additional DRAM die may be incorporated into the PoP structure in various locations, including within the bottom logic die package, as a co-package with the top NAND die package, and as a hybrid package structure between the top NAND die package and the bottom logic die package.

In one aspect, embodiments describe package on package (PoP) fabrication techniques and structures that take into account an ability to integrate fully tested NAND die packages with known good DRAM die. It has been observed that NAND die are more effectively tested after packaging, while DRAM die can be tested at the die level. Accordingly, embodiments account for this observation. Furthermore, the packaging sequences and structures can facilitate the integration of fully tested NAND packages and known good DRAM dies from different vendors.

In another aspect, it has been observed that exposure of DRAM die to high temperature processes during packaging can result in DRAM refresh window degradation. In particular, it has been observed such degradation may result during thermal cure operations commonly utilized during cure of redistribution layer (RDL) dielectric layers. For example, a conventional polyimide RDL material may be commonly cured at temperatures above 200° C. In accordance with some embodiments, packaging sequences and structures are described that avoid the formation of RDLs after integration of the DRAM die into the packaging sequence.

Aspects of the various embodiments may additionally include, reduced cycle times, warpage control, elimination of additional RDLs, etc.

In the following description and figures, various process flows are illustrated and described for fabricating a PoP structure. While single PoP structures are illustrated in the figures, it is to be appreciated that these may be repeating structures across a carrier substrate, or reconstituted wafer/panel in accordance with embodiments. Additionally, while the following processing sequences are illustrated and described separately, the separate processing sequences may share some similar structures and processes, which in the interest of conciseness and clarity may not necessarily be described separately or referenced in each figure herein where such descriptions or references would be unduly repetitive.

The terms “over”, “to”, “between”, and “on” as used herein may refer to a relative position of one layer with respect to other layers. One layer “over” or “on” another layer or bonded “to” or in “contact” with another layer may be directly in contact with the other layer or may have one or more intervening layers. One layer “between” layers may be directly in contact with the layers or may have one or more intervening layers.

FIG. 1 is a schematic cross-sectional side view illustration of a package on package structure including a top package having a memory. In some embodiments, the memory may be a non-volatile memory such as a NAND flash memory. However, other memory structures, non-volatile or volatile may be used as the top package. As illustrated, a package on package structure 300 may include a top package 200 mounted on a bottom package 100.

The bottom package 100 may include a first level redistribution layer (RDL) 110, a first die 130 attached to a top side 111 of the first level RDL 110 with a first plurality of solder bumps 138, and a first level molding compound 140 encapsulating the first die 130 on the top side 111 of the first level RDL 110. A second level RDL 160 is formed over the first die 130 and the first level molding compound 140. In an embodiment, the second level RDL 160 is formed directly on a top side 131 of the first die 130, and a top side of the first level molding compound 140. A first plurality of conductive pillars 150 extend from the top side 111 of the first level RDL 110 to a bottom side 163 of the second level RDL 160. A second die 170 is attached to a top side 161 of the second level RDL 160 with a second plurality of solder bumps 178, a second level molding compound 190 encapsulates the second die 170 on the top side 161 of the second level RDL 160, and a second plurality of conductive pillars 180 extend from the top side 161 of the second level RDL 160 through the second level molding compound 190. In some embodiments, the second die may be a memory such as a DRAM, but in other embodiments the second die may be a logic chip such as an application processor or system-on-chip (SoC). Top package 200 is mounted on the bottom package 100 with a plurality of package solder bumps 220, with the package solder bumps 220 being bonded to the second plurality of conductive pillars 180. As shown, an underfill material 250 may be applied between the bottom package 100 and the top package 200, and laterally surrounding the package solder bumps 220 to secure the top package 200 to the bottom package 100 and protect the integrity of the joints formed by the package solder bumps 220.

In a specific embodiment, the top package 200 comprises a NAND die 230, the second die 170 is a DRAM die, and the first die 130 is a logic die, such as an SoC die or ASIC die.

Figure 2:
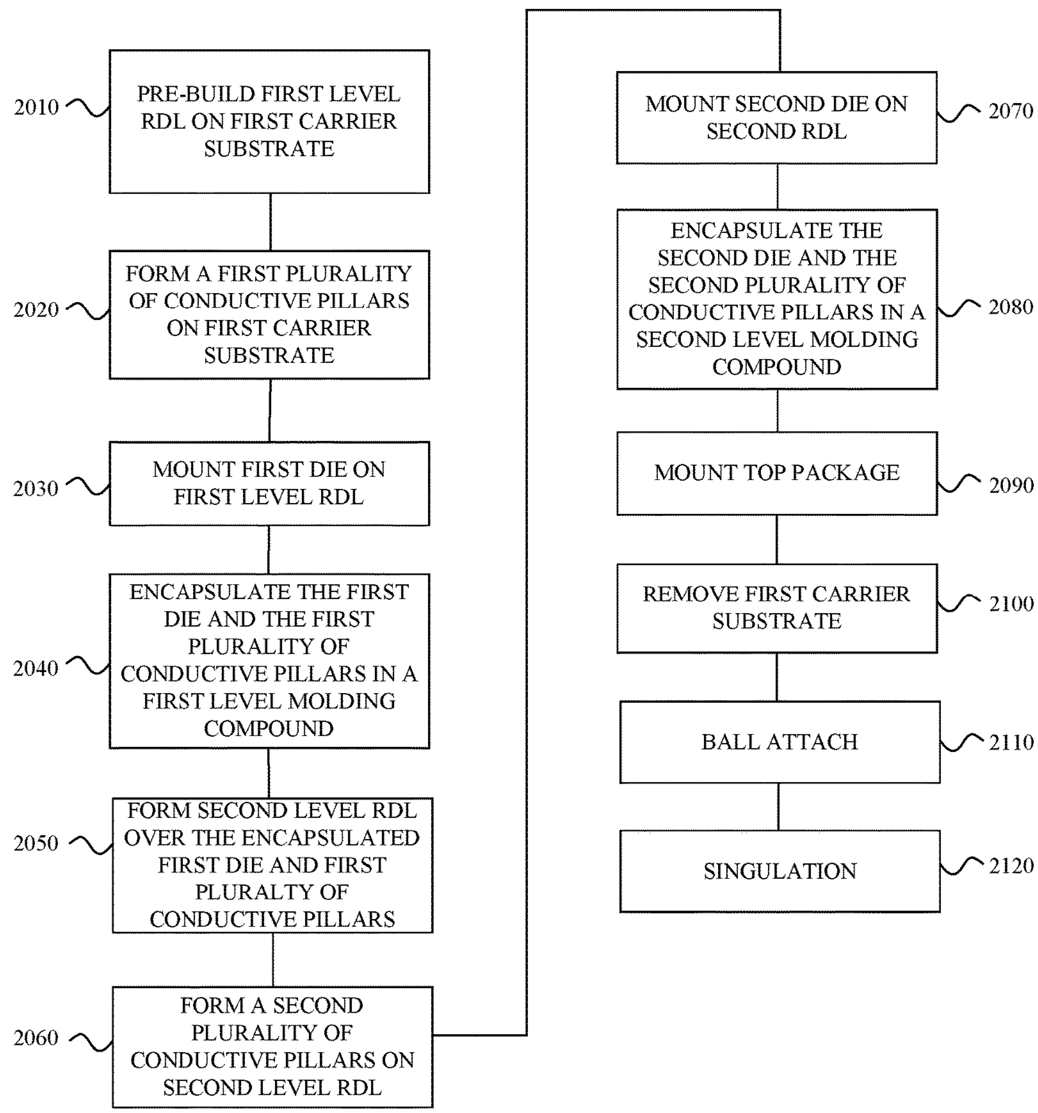
FIG. 2 is a flow chart illustrating a process of forming a package on package structure including a top memory package of FIG. 1 in accordance with an embodiment.

FIG. 2 is a flow chart illustrating a process of forming a package on package structure including a top memory package of FIG. 1 in accordance with an embodiment. In interests of clarity, the process illustrated in FIG. 2 is described concurrently with the schematic cross-sectional side view illustrations of FIGS. 2A-2D and FIG. 1.

At operation 2010 the first level RDL 110 is pre-built onto a first carrier substrate 102 such as a bare wafer or panel. The first level RDL 110 may include a single redistribution line 112 or multiple redistribution lines 112 and dielectric layers 114. The first level RDL 110 may be formed by a layer-by-layer process, and may be formed at the wafer level using thin film technology. In an embodiment, the first level RDL 110 has a total thickness of less than 50 μm, or more specifically less than 30 μm. In an embodiment, the first level RDL 110 includes embedded redistribution lines 112 (embedded traces). For example, the redistribution lines 112 may be created by first forming a seed layer, followed by forming a metal (e.g. copper) pattern. Alternatively, redistribution lines may be formed by deposition (e.g. sputtering) and etching. The material of redistribution lines 112 can include, but is not limit to, a metallic material such as copper, titanium, nickel, gold, and combinations or alloys thereof. The metal pattern of the redistribution lines 112 is embedded in one or more dielectric layers 114, which is optionally patterned. The dielectric layer(s) 114 may be any suitable material such as an oxide, or polymer (e.g. polyimide).

In an embodiment, a bottom side 113 of the first level RDL 110 may include under bump metallurgy (UBM) pads 118, for example, for receiving solder bumps 120 for bonding of the PoP structure 300 to a circuit board. A top side 111 of the first level RDL 110 may include contact pads 116 for bonding with addition die or as seed layers for growth of conductive pillars 150. The material of conductive pillars 150 can include, but is not limited to, a metallic material such as copper, titanium, nickel, gold, and combinations or alloys thereof. Conductive pillars 150 may be formed at operation 2020 using a suitable processing technique, and may be formed of a variety of suitable materials (e.g. copper) and layers. In an embodiment, conductive pillars 150 are formed by a plating technique, such as electroplating using a patterned photoresist layer to define the conductive pillar 150 dimensions, followed by removal of the patterned photoresist layer.

Figure 2A:
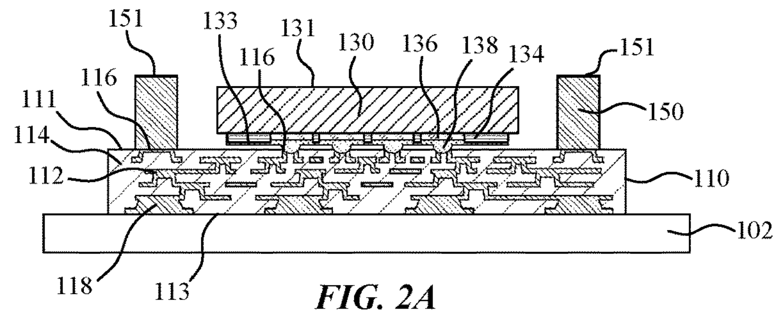
FIGS. 2A-2D are schematic cross-sectional side view illustrations of a process of forming the package on package structure of FIG. 1 in accordance with an embodiment.

First die 130 is then mounted onto the top side 111 of the first level RDL 110 at operation 1030. In an embodiment, first die 130 is a logic die (e.g. SoC, ASIC). As shown, the first die 130 may be mounted on the first level RDL 110 such that it is laterally surrounded by the first plurality of conductive pillars 150, or alternatively a first plurality of conductive pillars are located (e.g. in one or more rows) adjacent to one or more lateral sides of the first die 130. As previously described, the particular illustration in FIG. 2A is representative of a process sequences for fabrication a single package on package structure. In accordance with embodiments, the structure illustrated at FIG. 2A is at the wafer or panel level, and a plurality of first die 130 are mounted at operation 2030. In an embodiment, the first die 130 includes a top side 131 and bottom side 133. The bottom side 133 may include a plurality of contacts 136 (e.g. contact pads, or studs), a passivation layer 134, and a plurality of solder bumps 138 attached to the plurality of contacts 136. In accordance with embodiments, the first die 130 may be attached using a flip chip technique in which the plurality of solder bumps 138 is bonded to a plurality of contact pads 116 along the top side 111 of the first level RDL 110.

The first die 130 and first plurality of conductive pillars 150 may then be encapsulated in a first level molding compound 140 on the top side 111 of the first level RDL 110 at operation 2040. For example, the first level molding compound 140 may include a thermosetting cross-linked resin known in electronic packaging. In an embodiment, the first level molding compound 140 is cured at a lower temperature, e.g. 170° C., than a dielectric material used for forming the first level RDL 110. Encapsulation may be accomplished using a suitable technique such as, transfer molding, compression molding, and lamination. As used herein, "encapsulate" does not require all surfaces to be encased within a molding compound. In the embodiment illustrated in FIG. 2B the lateral sides of the first die 130 and conductive pillars 150 are encased in the first level molding compound 140. The first level molding compound 140 may also be formed over the top sides of the first die 130 and the conductive pillars, though this is not required. In an embodiment, the first level molding compound 140 is continuous, or semi-continuous, across the first carrier substrate 102, covering a plurality of groupings of first die 130 corresponding to separate package on package structures that will subsequently be singulated.

In accordance with embodiments, a top side 141 of the first level molding compound 140 can be patterned to expose top sides 151 of the first plurality of conductive pillars 150. In an embodiment, top side 141 of the first level molding compound 140 can be thinned to expose the top sides 151 of the first plurality of conductive pillars 150 and optionally a top side 131 of the first die 130. Additionally, a thickness of the first die 130, and optionally the conductive pillars 150, may be reduced during this operation.

A second level RDL 160 is then formed over the first die 130 and the top sides 151 of the first plurality of conductive pillars 150 at operation 2050. The second level RDL 160 may be formed similarly as the first level RDL 110, and may include single or multiple redistribution lines 162 and dielectric layers 164. In an embodiment, the redistribution lines 162, or more specifically, contact pads 166 of the redistribution lines 162 are formed directly on, and in electrical contact with, the top sides 151 of the conductive pillars 150. In some embodiments, the second level RDL 160 may be formed directly on a top side 131 of the first die 130.

Figure 2B:
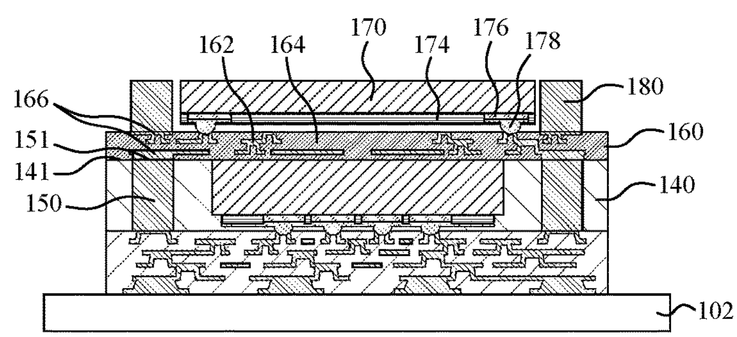

A second plurality of conductive pillars 180 are then formed on the second level RDL 160 at operation 2060, followed by mounting of second die 170 on the second level RDL 160 at operation 2070, as shown in FIG. 2B. In accordance with embodiments, the second plurality of conductive pillars 180 may be formed similarly as the first plurality of conductive pillars 150, and the second die 170 may be mounted similarly as the first die 130 (e.g. flip chip mounting with a second plurality of solder bumps 178), and arranged with the second plurality of conductive pillars 180 similarly as the first die 130 is arranged with the first plurality of conductive pillars 150. In an embodiment, the bottom side 173 of the second die 170 may include a plurality of contacts 176 (e.g. contact pads, or studs), a passivation layer 174, and a plurality of solder bumps 178 attached to the plurality of contacts 176.

Figure 2C:
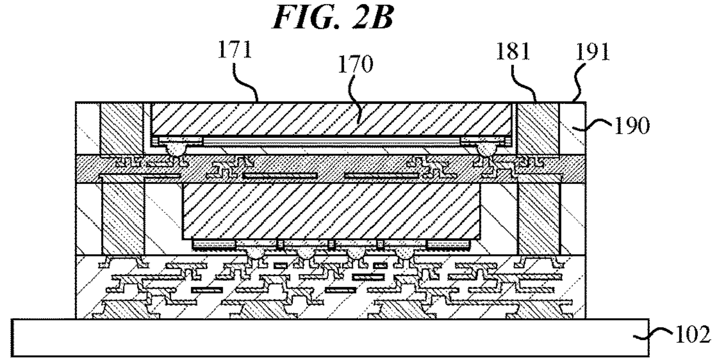

Referring now to FIG. 2C, the second die 170 and the second plurality of conductive pillars 180 are encapsulated within a second level molding compound 190 at operation 2080. Molding may be performed similarly as with the first level molding compound 140. Following the molding operation, the second level molding compound 190, second plurality of conductive pillars 180, and the second die 170 may optionally be thinned, resulting in top sides 191, 181, 171, respectively. In accordance, with embodiments, processing to this point may be performed at the wafer or panel level.

Figure 2D:
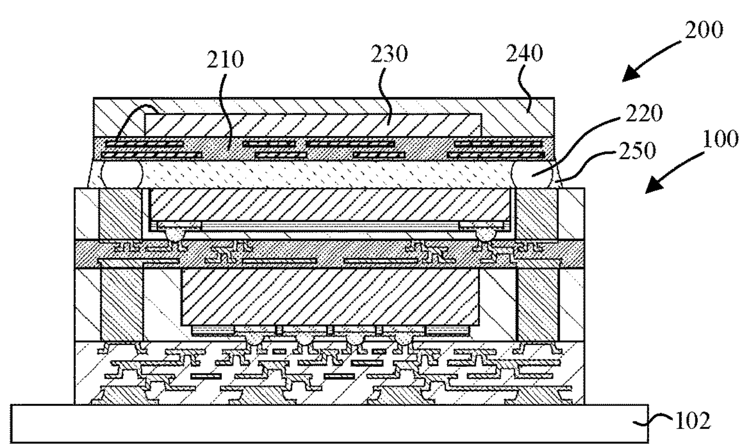

Referring now to FIG. 2D, a plurality of top packages 200 are mounted on a corresponding plurality of areas of the reconstituted structure that will become the plurality of bottom packages 100 at operation 2090. Mounting may be performed using a suitable technique such as flip chip, with package solder bumps 220 used to bond the top packages 200 to the second plurality of conductive pillars 180. Following the bonding of the top packages 200 with package solder bumps 220, an underfill material 250 can be applied between the bottom package 100 areas and the top package 200, with the underfill material 250 laterally surrounding the package solder bumps 220.

Referring now to FIG. 2, and operations 2100, 2110 the first carrier substrate 102 may then be removed, followed by attaching solder bumps 120 to the UBM pads 118 of the first level RDL 110. Individual PoP structures 300 may then be singulated from the reconstituted structure at operation 2120.

Referring again to FIG. 1, the top package 200 includes a third die 230. In an embodiment the third die 230 is a NAND die. In an embodiment, the second die 170 is a DRAM die. The top package 200 may have a variety of configurations in accordance with embodiments. For example, the top package 200 may include a top package RDL 210, with the third die 230 attached to the top package RDL 210. The top package RDL 210 may be a wiring layer, or may be formed similarly as the first or second level RDLs. The top package RDL 210 may include one or more redistribution lines 212 and dielectric layers 214. In an embodiment, the third die 230 is attached to a top side 211 the top package RDL 210 with a die attach film, and electrically connected to the top package RDL 210 with a wire bond 260. The underfill material 250 may be formed in the space below the bottom side 213 of the top package RDL 210. The third die 230, and optional wire bond 260, may be encapsulated in a top package molding compound 240 on the top side 211 of the top package RDL 210.

In accordance with embodiments, the packaging process and resulting structure of the PoP structure 300 illustrated in FIG. 1 does not require lateral circuit board space for routing between adjacent die, allows the ability to integrate fully tested NAND die packages with known good DRAM die, and does not expose a packaged DRAM die to RDL formation. Additionally, the packaging process may be performed on a single first carrier substrate 102, which can affect warpage control of the resultant PoP structures 300. Furthermore, the first level RDL 110 can be pre-built prior to availability of the first die 130.

Figure 3A:
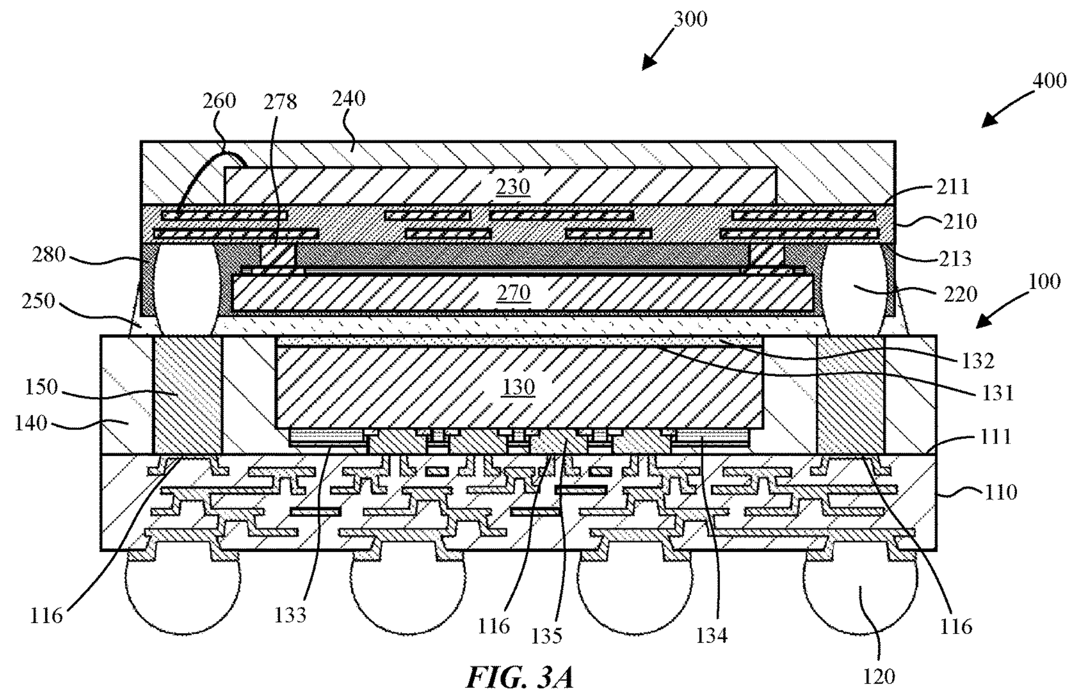
FIGS. 3A-3B are schematic cross-sectional side view illustrations of package on package structures including a top NAND/DRAM co-package in accordance with an embodiment.
Figure 3B:
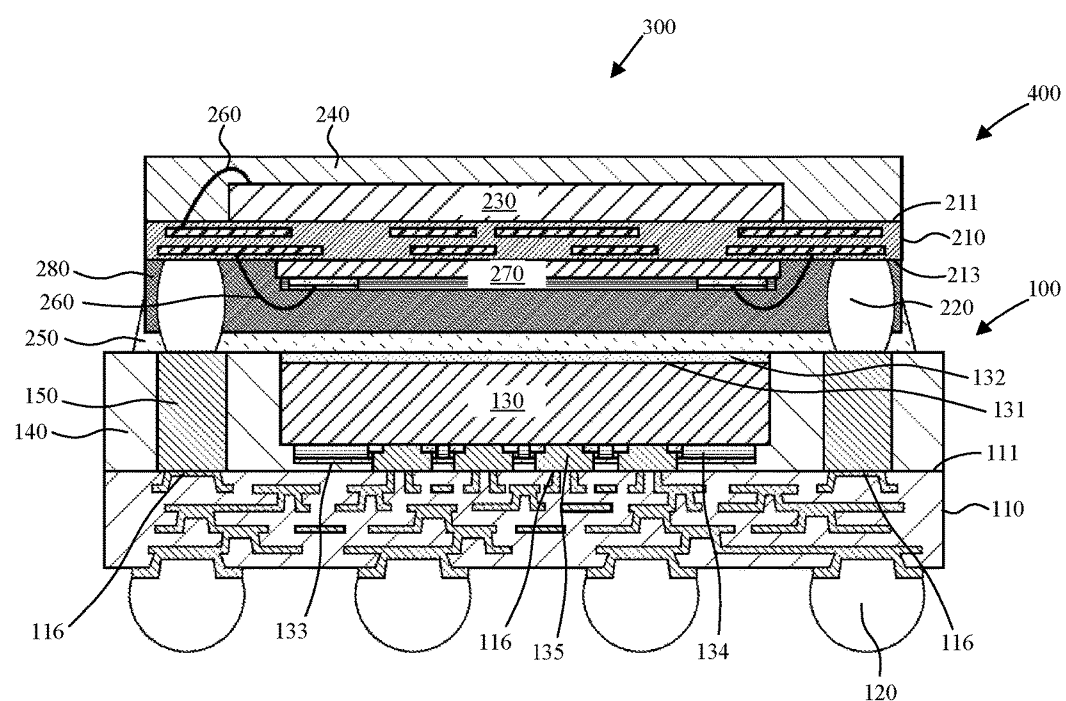

FIGS. 3A-3B are schematic cross-sectional side view illustrations of package on package structures 300 including a top NAND/DRAM co-package in accordance with an embodiment. As illustrated, a package on package structure 300 may include a top package 400 mounted on a bottom package 100. In an embodiment, the bottom package 100 includes a first level RDL 110, a first die 130 on a top side 111 of the first level RDL 110, such that the first level RDL 110 is formed directly on a metallic contact 135 along the bottom side 133 of the first die. For example, the metallic contact 135 may be an exposed surface of a non-solder material stud bump or contact pad. A first level molding compound 140 encapsulates the first die 130 on the top side 111 of the first level RDL 110, and a first plurality of conductive pillars 150 extend from the top side 111 of the first level RDL 110 and through the first level molding compound 140.

A top package 400 is mounted on the bottom package 100 with a plurality of package solder bumps 220. As illustrated, the package solder bumps 220 are bonded to the first plurality of conductive pillars 150. In the embodiments illustrated in FIGS. 3A-3B, the top package 400 includes a top package RDL 210, a second die 270 attached to a bottom side 213 of the top package RDL 210, and a lower molding compound 280 that encapsulates the second die 270 on the bottom side 213 of the top package RDL 210. A third die 230 is attached to a top side 211 of the top package RDL 210, and a top package molding compound 240 encapsulates the third die 230 on the top side 211 of the top package RDL 210. In an embodiment, the plurality of package solder bumps 220 extend through the lower molding compound 280 from the bottom side 213 of the top package RDL 210 to the first plurality of conductive pillars 150. In an embodiment, an underfill material 250 is located between the bottom package 100 and the top package 400, with the underfill material 250 laterally surrounding the package solder bumps 220.

In accordance with embodiments, the top package 400 may be a co-package including both NAND and DRAM die. For example, third die 230 may be a NAND die, while second die 270 may be a DRAM die in an embodiment. While top package 400 is illustrated in the particular embodiment as including a NAND die and a DRAM die, other memory dies may also be used as third die 230 and second die 270. In the particular embodiment illustrated in FIG. 3A the second die 270 is mounted onto the top package RDL 210. For example, the second die 270 can be flip chip mounted, using solder bumps 278. In the particular embodiment illustrated in FIG. 3B the second die 270 is attached to the top package RDL 210 with a die attach film and electrically connected to the top package RDL 210 with wire bonds 260. In these manners, known good DRAM die may be integrated with fully tested NAND die packages, together in the top package 400. Thus, the top packages 400 may be characterized as co-packages including both NAND and DRAM die.

Figure 4:
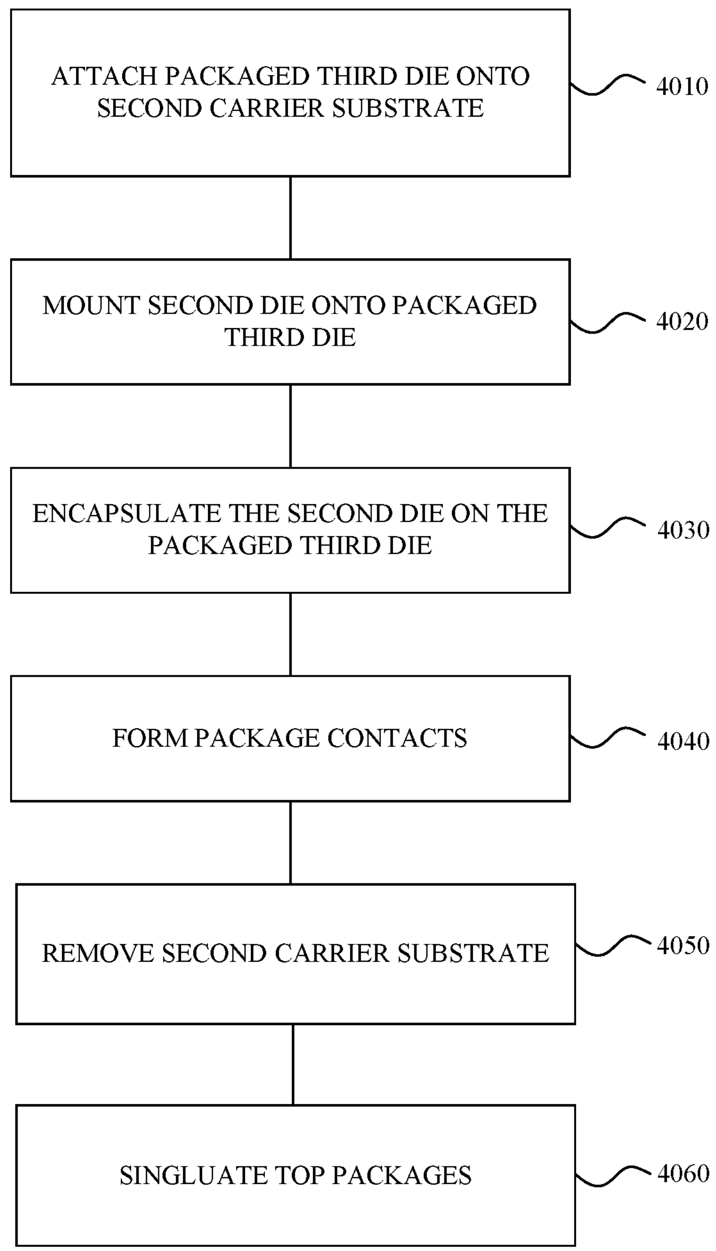
FIG. 4 is a flow chart illustrating process of forming the top NAND/DRAM co-packages of FIGS. 3A-3B in accordance with an embodiment.

FIG. 4 is a flow chart illustrating process of forming the top packages 400 (e.g. NAND/DRAM co-packages) of FIGS. 3A-3B in accordance with an embodiment. In interests of clarity, the process illustrated in FIG. 4 is described concurrently with the schematic cross-sectional side view illustrations of FIGS. 4A-4D and FIGS. 3A-3B.

Figure 4A:
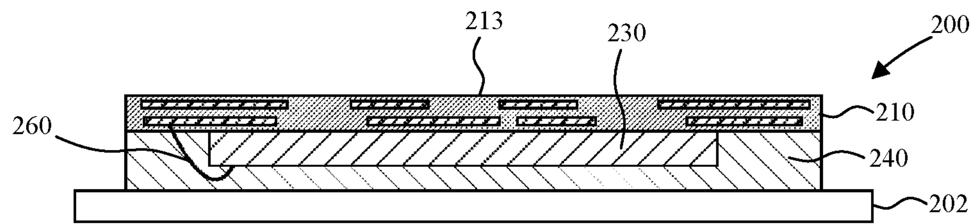
FIGS. 4A-4D are schematic cross-sectional side view illustrations of a process of forming the top NAND/DRAM co-packages of FIGS. 3A-3B in accordance with an embodiment.
Figure 4B:
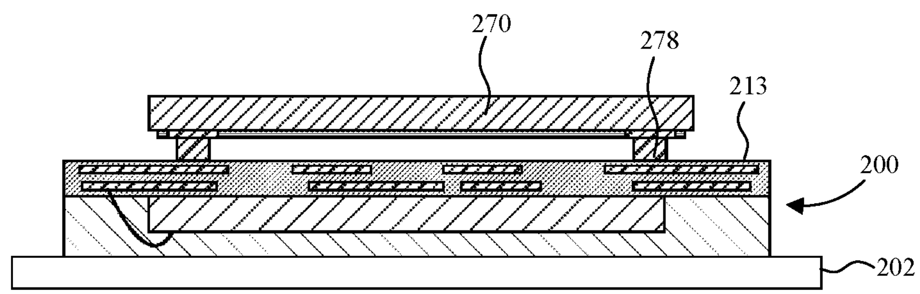

At operation 4010 packaged third die 230 are attached to a second carrier substrate 202. The packaged third die 230 may be in the form of packages similar to top packages 200 previously described. As shown in FIG. 4A the packaged third die 230 are attached to the second carrier substrate 202 with top package RDLs 210 facing up. At operation 4020 the second die 270 are then mounted onto the bottom sides 213 of top package RDLs 210 of the packaged third die 230 (e.g. top packages 200). For example, the second die may be flip chip bonded with solder bumps 278 as illustrated in FIG. 4B and FIG. 3A, or alternatively attached with a die attach film and wire bonded with wire bonds 260 as illustrated in FIG. 3B.

Figure 4C:
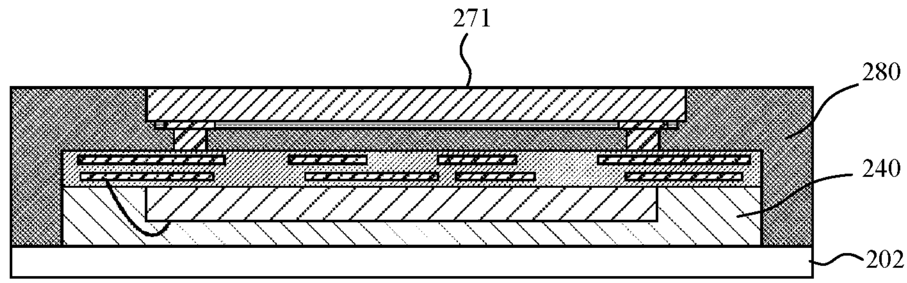
Figure 4D:
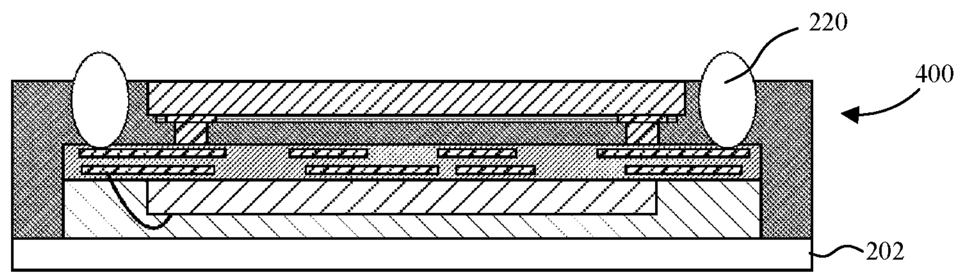

At operation 4030 the second die 270 is encapsulated on the top package RDL 210 of the packaged third die 230 with a lower molding compound 280. For example, molding may be overmolding or exposed molding as illustrated in FIG. 4C. As illustrated, the top side 271 of the second die 270 is optionally exposed, for example, with an exposed molding technique or as a result of a thinning operation performed after molding. In an embodiment, lower molding compound 280 laterally surrounds the top package RDL 210 and top package molding compound 240 of the packaged third die 230. Package contacts may then be formed at operation 4040. In an embodiment, package contacts are formed by laser ablation of the lower molding compound 280 to expose the top package RDL 210, followed by ball drop of package solder bumps 220. The second carrier substrate 202 may then be removed from the reconstituted structure at operation 4050 followed by singulation of multiple top packages 400 at operation 4060.

Figure 5:
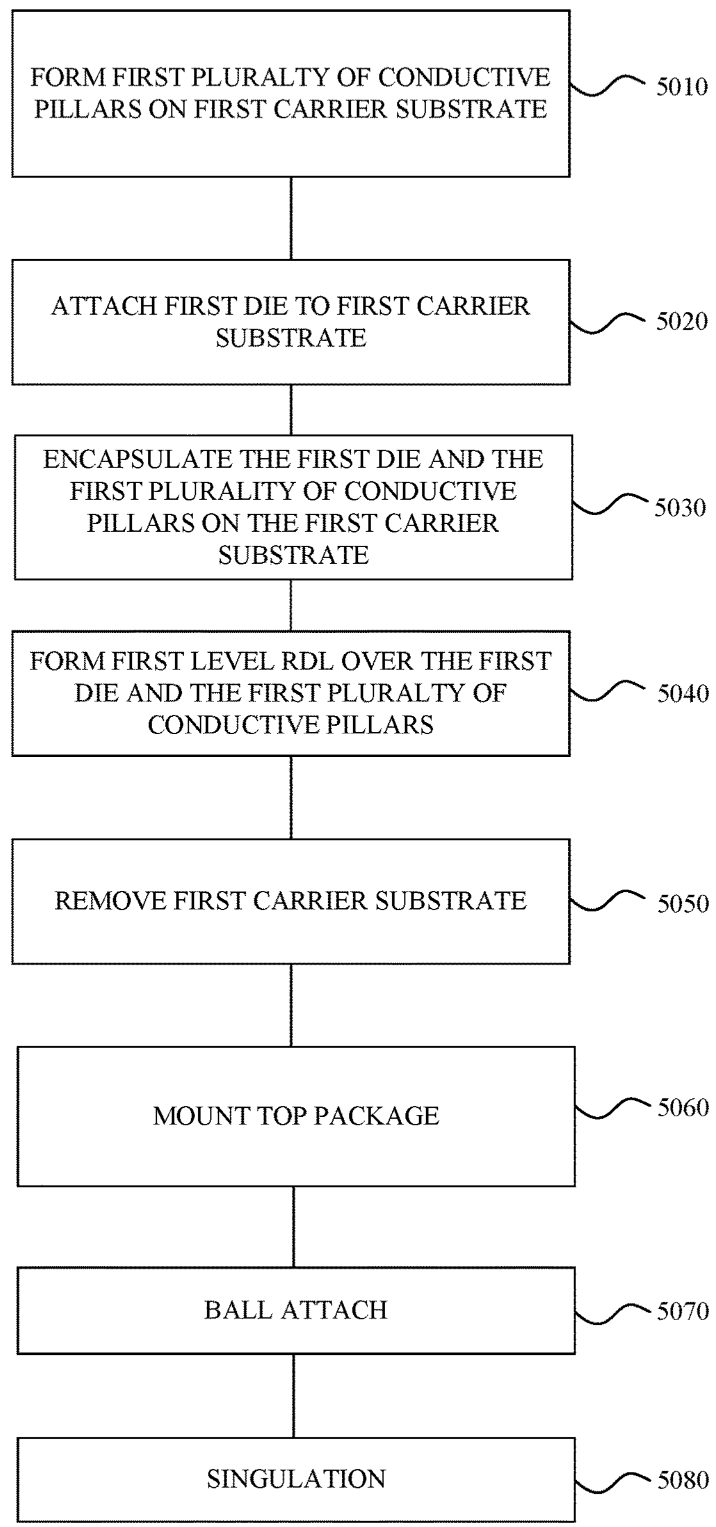
FIG. 5 is a flow chart illustrating a process of forming the package on package structures of FIGS. 3A-3B in accordance with an embodiment.
Figure 5A:
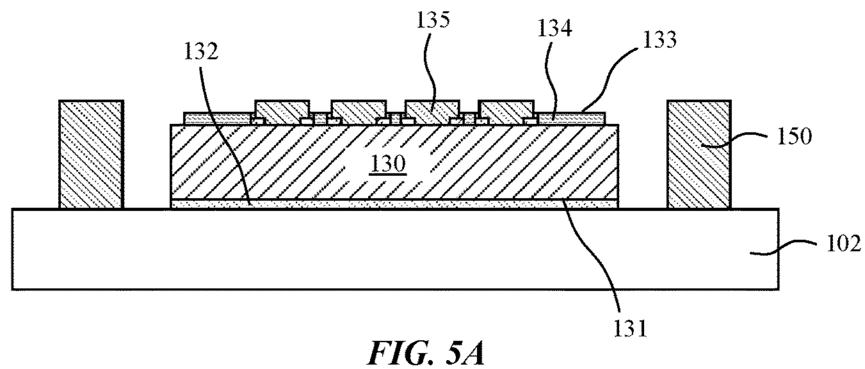
FIGS. 5A-5C are schematic cross-sectional side view illustrations of a process of forming the package on package structures of FIGS. 3A-3B in accordance with an embodiment.

FIG. 5 is a flow chart illustrating a process of forming the package on package structures 300 of FIGS. 3A-3B in accordance with an embodiment. In interests of clarity, the process illustrated in FIG. 4 is described concurrently with the schematic cross-sectional side view illustrations of FIGS. 5A-5C and FIGS. 3A-3B. Referring to FIG. 5A a first plurality of conductive pillars 150 are formed on the first carrier substrate 102 at operation 5010 followed by attaching the first die 130 to the carrier substrate at operation 5020. As shown, a top side 131 of the first die 130 is attached to the first carrier substrate 102 with an adhesive layer 132. A bottom side 133 of the first die includes a passivation layer 134 and a plurality of metallic contacts 135. For example, the metallic contacts 135 may be an exposed surface of a non-solder material stud bump or contact pad.

Figure 5B:
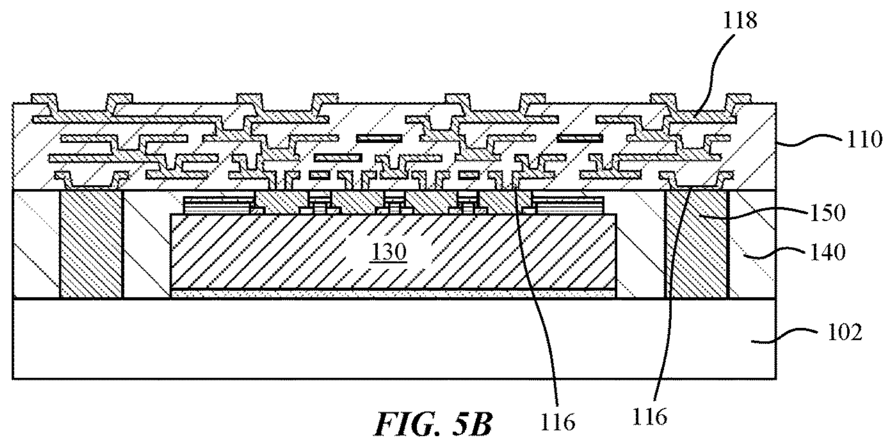

Referring now to FIG. 5B, the first die 130 and the first plurality of conductive pillars 150 are encapsulated in a first level molding compound 140 at operation 5030. The molded structure is then optionally thinned or patterned to expose the metallic contacts 135 and first plurality of conductive pillars 150. A first level RDL 110 is then formed directly on and in electrical contact with the metallic contacts 135 along the bottom side 133 of the first die and the first plurality of conductive pillars 150 at operation 5040. For example, contact pads 116 of the first level RDL are formed directly on the metallic contacts 135 and first plurality of conductive pillars 150. The first carrier substrate 102 may then be removed from the reconstituted structure at operation 5050.

Figure 5C:
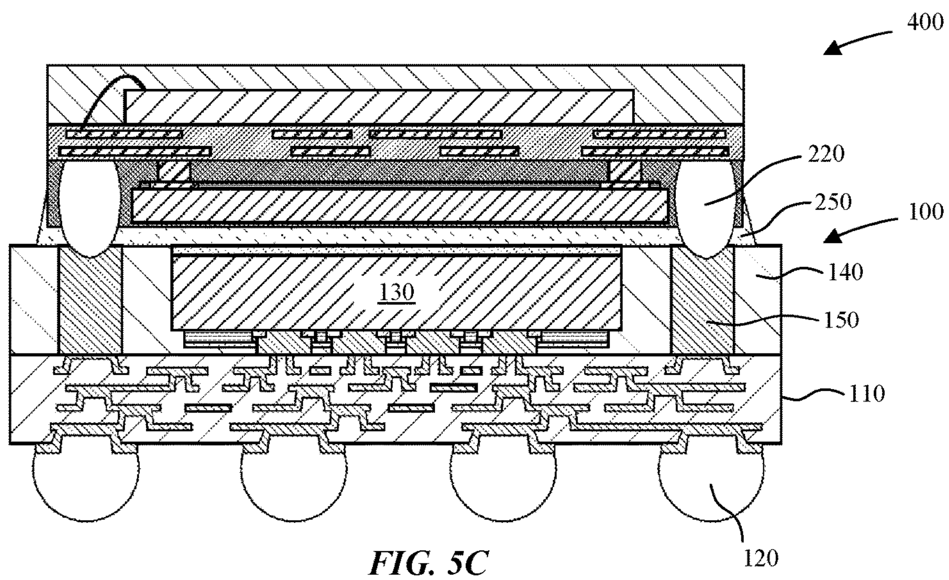

Referring now to FIG. 5C, a plurality of top packages 400 are mounted on a corresponding plurality of areas of the reconstituted structure that will become the plurality of bottom packages 100 at operation 5060. Mounting may be performed using a suitable technique such as flip chip, with package solder bumps 220 used to bond the top packages 400 to the first plurality of conductive pillars 150. Following the bonding of the top packages 400 with package solder bumps 220, an underfill material 250 can be applied between the bottom package 100 areas and the top package 400, with the underfill material 250 laterally surrounding the package solder bumps 220. Solder bumps 120 may then be attached to the UBM pads 118 of the first level RDL 110 at operation 5070. Individual package on package structures 300 may then be singulated from the reconstituted structure at operation 5080.

In accordance with embodiments, the packaging process and resulting structure of the PoP structure 300 illustrated in FIGS. 3A-3B does not require lateral circuit board space for routing between adjacent die, allows the ability to integrate fully tested NAND die packages with known good DRAM die, and does not expose a packaged DRAM die to RDL formation. Furthermore, the process cycle can be broken into distinct areas. For example, the first level RDL 110 can be pre-built prior to availability of the first die 130, and the top package 400 (e.g. NAND/DRAM co-package) can be fabricated independent of first die 130 integration.

Figure 6A:
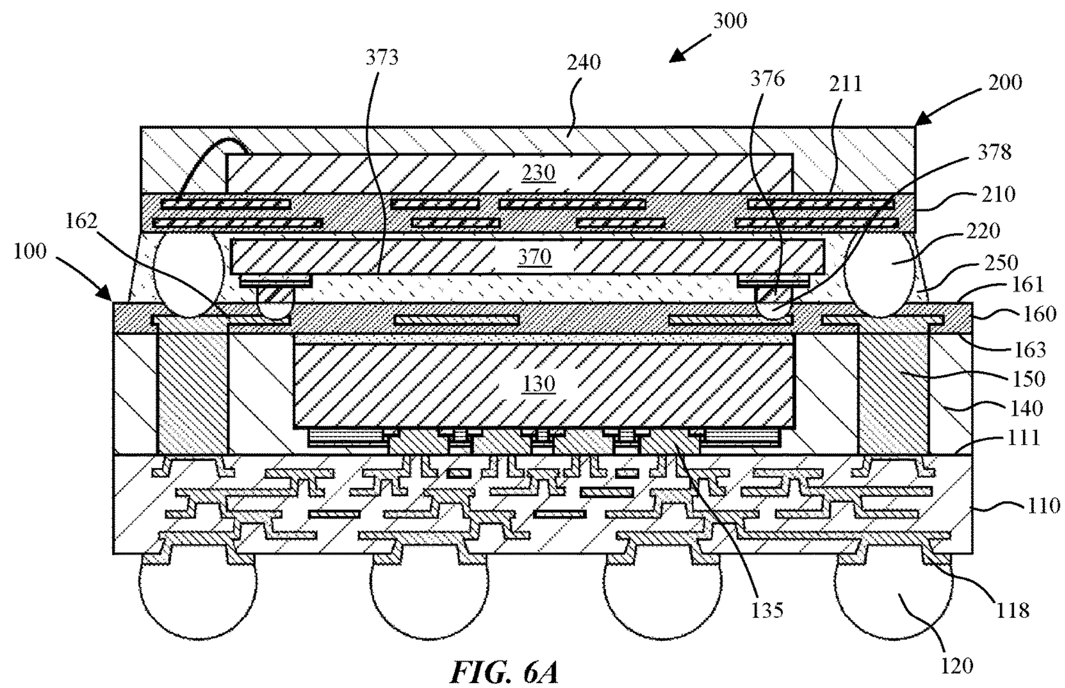
FIGS. 6A-6B are schematic cross-sectional side view illustrations of package on package structures including a hybrid top DRAM die and NAND package structure in accordance with an embodiment.
Figure 6B:
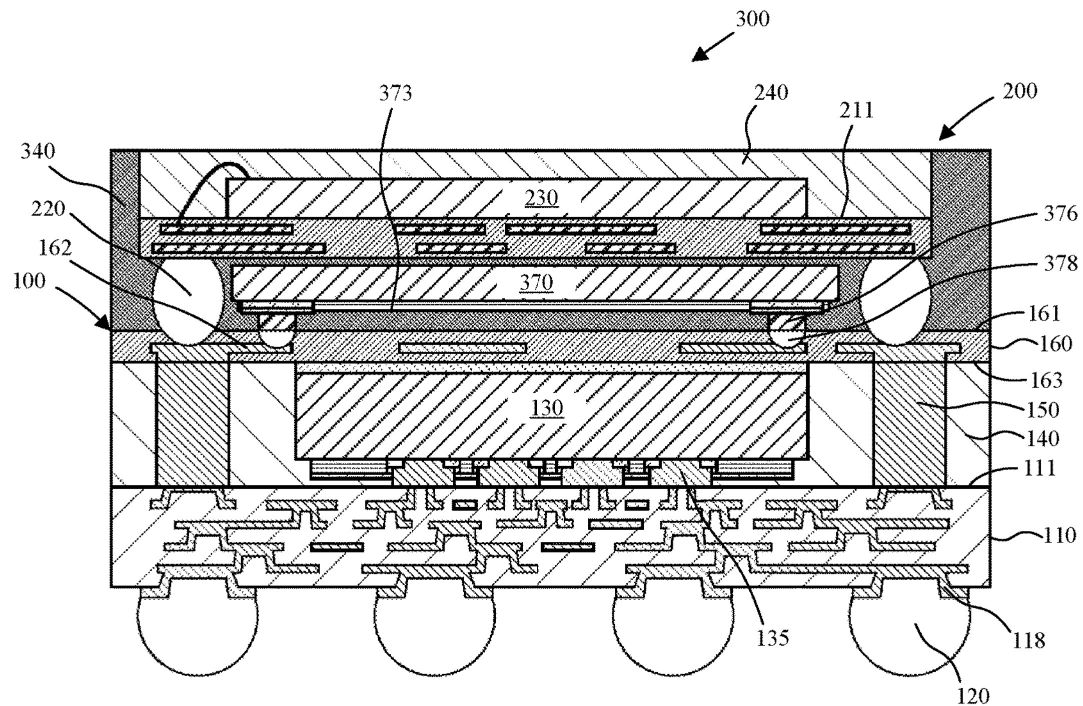

FIGS. 6A-6B are schematic cross-sectional side view illustrations of package on package structures including a hybrid top DRAM die and NAND package structure in accordance with an embodiment. As illustrated, a package on package structure 300 may include a top package 200 mounted on a bottom package 100. The bottom package 100 includes a first level RDL 110, a first die 130 on a top side 111 of the first level RDL 110, such that the first level RDL 110 is formed directly on a metallic contact 135 along the bottom side 133 of the first die. For example, the metallic contact 135 may be an exposed surface of a non-solder material stud bump or contact pad. A first level molding compound 140 encapsulates the first die 130 on the top side 111 of the first level RDL 110. A second level RDL 160 is over the first die 130 and the first level molding compound 140, and a first plurality of conductive pillars 150 extend from the top side 111 of the first level RDL 110 and through the first level molding compound 140 to a bottom side 163 of the second level RDL 160.

As illustrated in FIGS. 6A-6B, a second die 370 is mounted on a top side 161 of the second level RDL 160. For example, the second die 370 may be surface mounted with a plurality of solder bumps 378. In an embodiment, the bottom side 373 of the second die 370 may include a plurality of contacts 376 (e.g. contact pads, or studs) and a plurality of solder bumps 378 attached to the plurality of contacts 376. A top package 200 is also mounted on the bottom package 100 with a plurality of package solder bumps 220, with the package solder bumps 220 being bonded to the first plurality of conductive pillars 150 and laterally surrounding the second die 370. As shown, the top package 200 may include a top package RDL 210, a third die 230 attached to a top side 211 of the top package RDL 210, and a top package molding compound 240 that encapsulates the third die 230 on the top side 211 of the top package RDL 210.

In the embodiment illustrated in FIG. 6A, an underfill material 250 may be applied between the bottom package 100 and the top package 200, and laterally surrounding the package solder bumps 220 and the second die 370. In the embodiment illustrated in FIG. 6B, the top package 200, the plurality of package solder bumps 220, and the second die 370 may be encapsulated in a third molding compound 340. In some embodiments, the top package 200 comprises a NAND die 230, the second die 370 is a DRAM die, and the first die 130 is a logic die, such as an SoC die or ASIC die.

Figure 7:
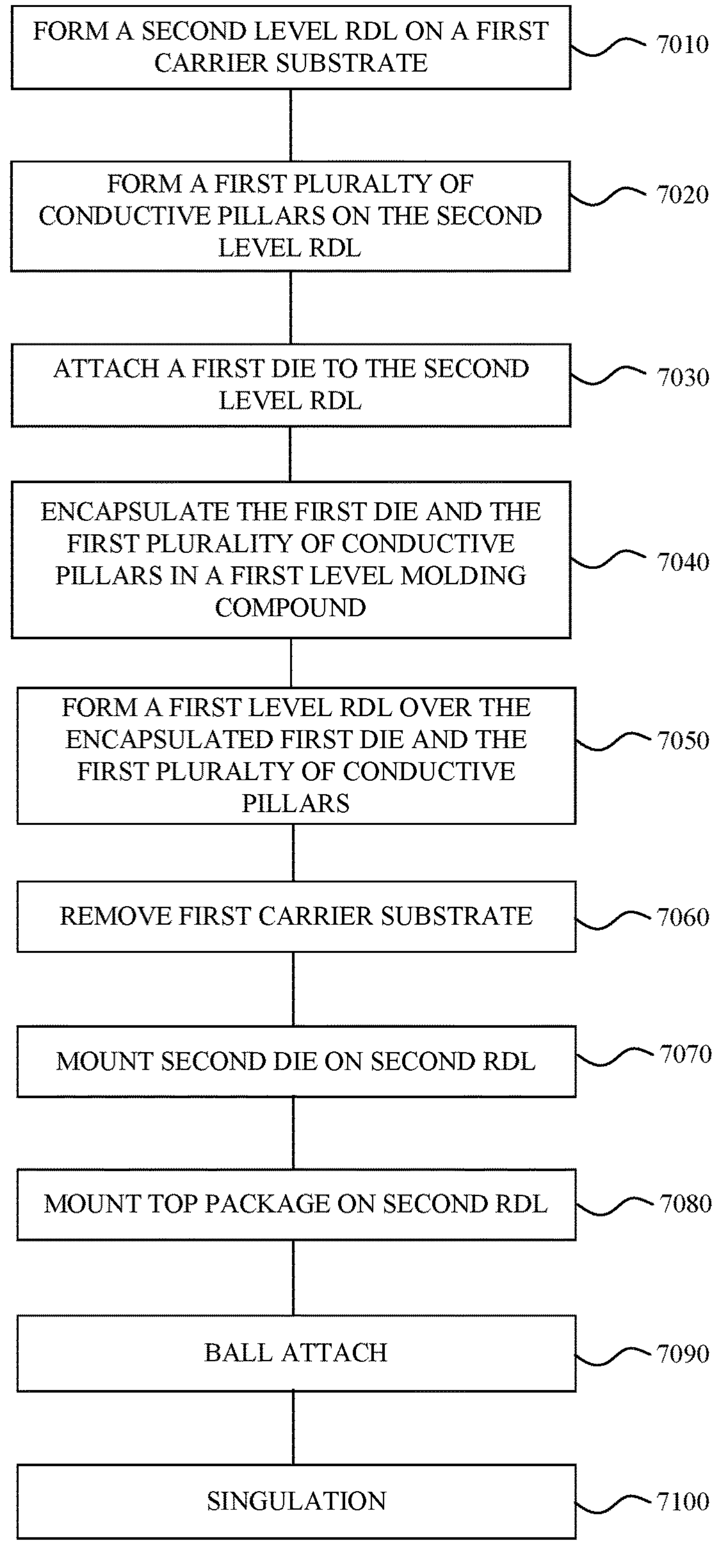
FIG. 7 is a flow chart illustrating a process of forming a package on package structure including a hybrid top DRAM die and NAND package structure of FIGS. 6A-6B in accordance with an embodiment.

FIG. 7 is a flow chart illustrating a process of forming a package on package structure including a hybrid top DRAM die and NAND package structure of FIGS. 6A-6B in accordance with an embodiment. In interests of clarity, the process illustrated in FIG. 7 is described concurrently with the schematic cross-sectional side view illustrations of FIGS. 7A-7C and FIGS. 6A-6B.

Figure 7A:
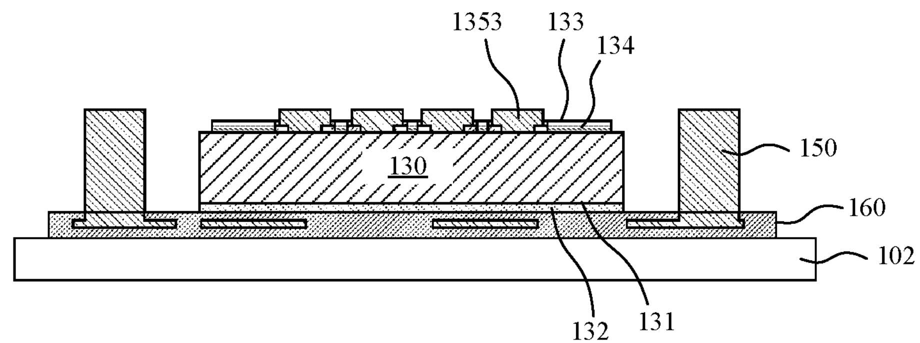
FIGS. 7A-7C are schematic cross-sectional side view illustrations of a process of forming the package on package structures including a hybrid top DRAM die and NAND package structure of FIGS. 6A-6B in accordance with an embodiment.

Referring to FIG. 7A a second level RDL 160 is formed on a first carrier substrate 102 at operation 7010. The second level RDL 160 may be formed similarly as previously described, and may include single or multiple redistribution lines 162. A first plurality of conductive pillars 150 are then formed on the second level RDL 160 at operation 7020, followed by attaching first die 130 to the second level RDL 160 at operation 2070. As shown, a top side 131 of the first die 130 is attached to the first carrier substrate 102 with an adhesive layer 132. A bottom side 133 of the first die 130 includes a passivation layer 134 and a plurality of metallic contacts 135. For example, the metallic contacts 135 may be an exposed surface of a non-solder material stud bump or contact pad. In accordance with embodiments, the first die 130 are arranged within the first plurality of conductive pillars 150 as described with regard to FIG. 2A.

Figure 7B:
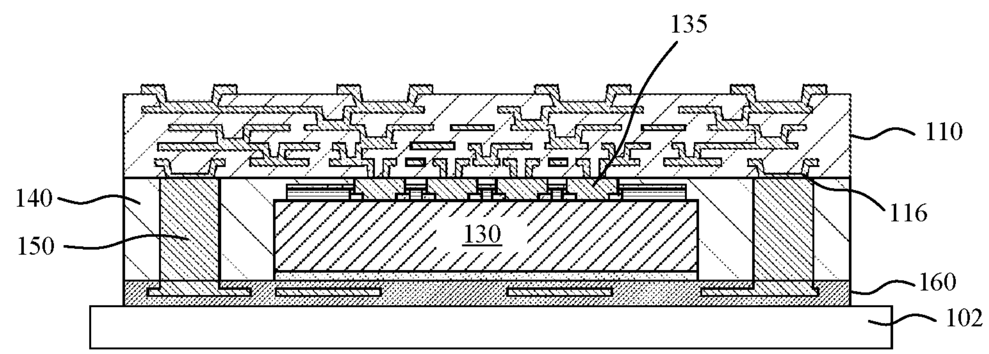

Referring now to FIG. 7B, the first die 130 and the first plurality of conductive pillars 150 are encapsulated in a first level molding compound 140 at operation 7040. The molded structure is then optionally thinned or patterned to expose the metallic contacts 135 and first plurality of conductive pillars 150. A first level RDL 110 is then formed directly on and in electrical contact with the metallic contacts 135 along the bottom side 133 of the first die and the first plurality of conductive pillars 150 at operation 7050. For example, contact pads 116 of the first level RDL are formed directly on the metallic contacts 135 and first plurality of conductive pillars 150. The first carrier substrate 102 may then be removed from the reconstituted structure at operation 7060.

Figure 7C:
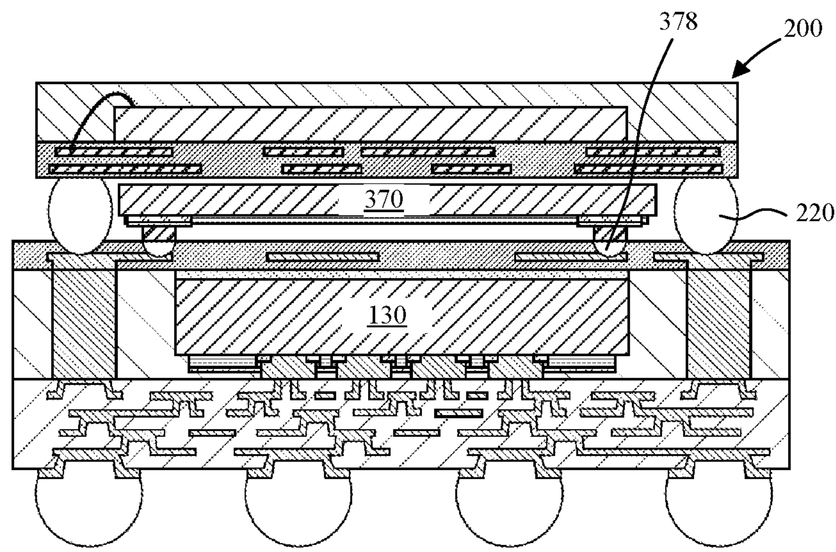

Referring now to FIG. 7C, a plurality of second die 370 are mounted onto the second level RDL 160 at operation 7070, followed by mounting a plurality of top packages 200 onto the second level RDL 160 at operation 7080. As illustrated, the plurality of top packages 200 are stacked over the plurality of second die 370. For example second die 370 may be flip chip mounted using solder bumps 378. Top packages 200 may likewise be mounted with package solder bumps 220. A minimal stand-off height may exist between a top side of the second die 370 and bottom side of the top package 200.

The second die 370 and top packages 200 may then be secured to the second level RDL 160 in more than one manner. In the embodiment illustrated in FIG. 6A, an underfill material 250 is applied between the bottom package 100 and the top package 200, and laterally surrounding the package solder bumps 220 and the second die 370. In the embodiment illustrated in FIG. 6B, the top package 200, the plurality of package solder bumps 220, and the second die 370 are encapsulated in a third molding compound 340. Solder bumps 120 may then be attached to the UBM pads 118 of the first level RDL 110 at operation 7090. Individual package on package structures 300 may then be singulated from the reconstituted structure at operation 7100.

In accordance with embodiments, the packaging process and resulting structure of the PoP structure 300 illustrated in FIGS. 6A-6B does not require lateral circuit board space for routing between adjacent die, allows the ability to integrate fully tested NAND die packages with known good DRAM die, and does not expose a packaged DRAM die to RDL formation. Furthermore, the process cycle can be broken into distinct areas for NAND packages, DRAM die, and logic die (e.g. SoC, ASIC) integration.

Figure 8:
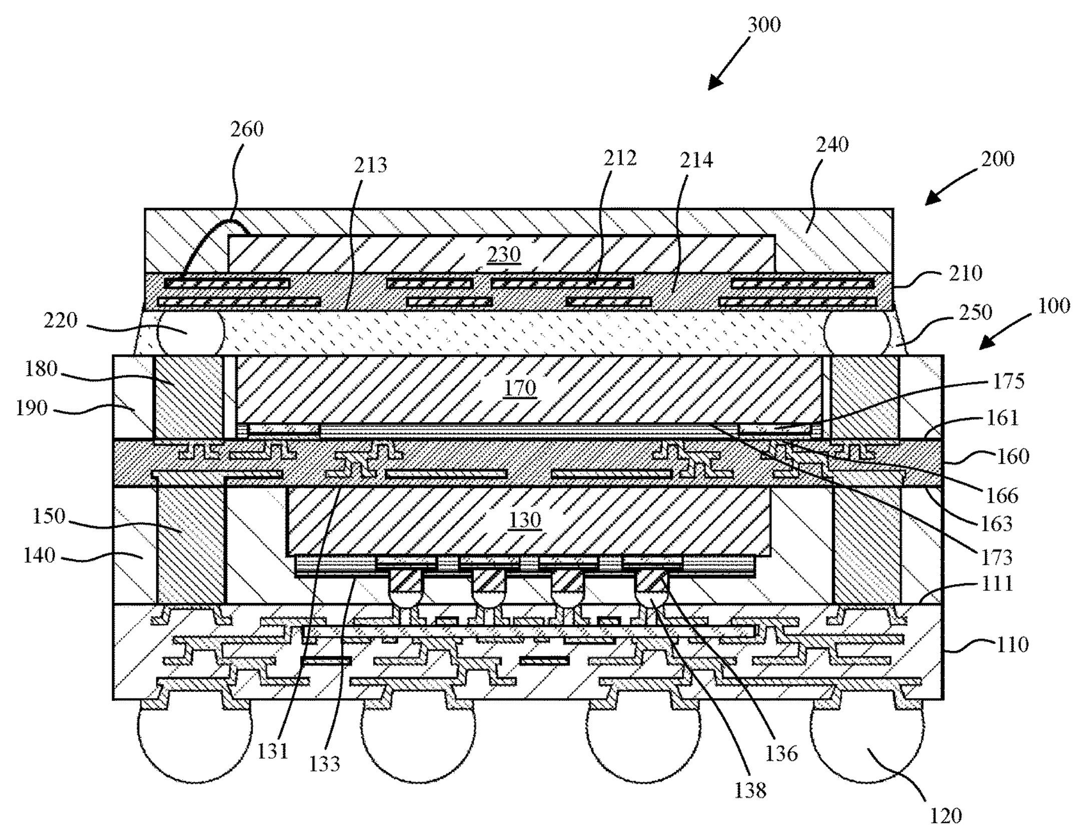
FIG. 8 is a schematic cross-sectional side view illustration of a package on package structure including a top NAND package in accordance with an embodiment.

FIG. 8 is a schematic cross-sectional side view illustration of a package on package structure including a top NAND package in accordance with an embodiment. As illustrated, a package on package structure 300 may include a top package 200 mounted on a bottom package 100.

The bottom package 100 may include a first level redistribution layer (RDL) 110, a first die 130 attached to a top side 111 of the first level RDL 110 with a first plurality of solder bumps 138, and a first level molding compound 140 encapsulating the first die 130 on the top side 111 of the first level RDL 110. A second level RDL 160 is formed over the first die 130 and the first level molding compound 140. In an embodiment, the second level RDL 160 is formed directly on a top side 131 of the first die 130, and a top side of the first level molding compound 140. A first plurality of conductive pillars 150 extend from the top side 111 of the first level RDL 110 to a bottom side 163 of the second level RDL 160. A second die 170 is attached to a top side 161 of the second level RDL 160, with the second level RDL directly on a metallic contact 175 along a bottom side 173 of the second die 170. A second level molding compound 190 encapsulates the second die 170 on the top side 161 of the second level RDL 160, and a second plurality of conductive pillars 180 extend from the top side 161 of the second level RDL 160 through the second level molding compound 190. A top package 200 is mounted on the bottom package 100 with a plurality of package solder bumps 220, with the package solder bumps 220 being bonded to the second plurality of conductive pillars 180. As shown, an underfill material 250 may be applied between the bottom package 100 and the top package 200, and laterally surrounding the package solder bumps 220 to secure the top package 200 to the bottom package 100 and protect the integrity of the joints formed by the package solder bumps 220.

In a specific embodiment, the top package 200 comprises a NAND die 230, the second die 170 is a DRAM die, and the first die 130 is a logic die, such as an SoC die or ASIC die, however other arrangements and types of die may be used in top package 200.

Figure 9:
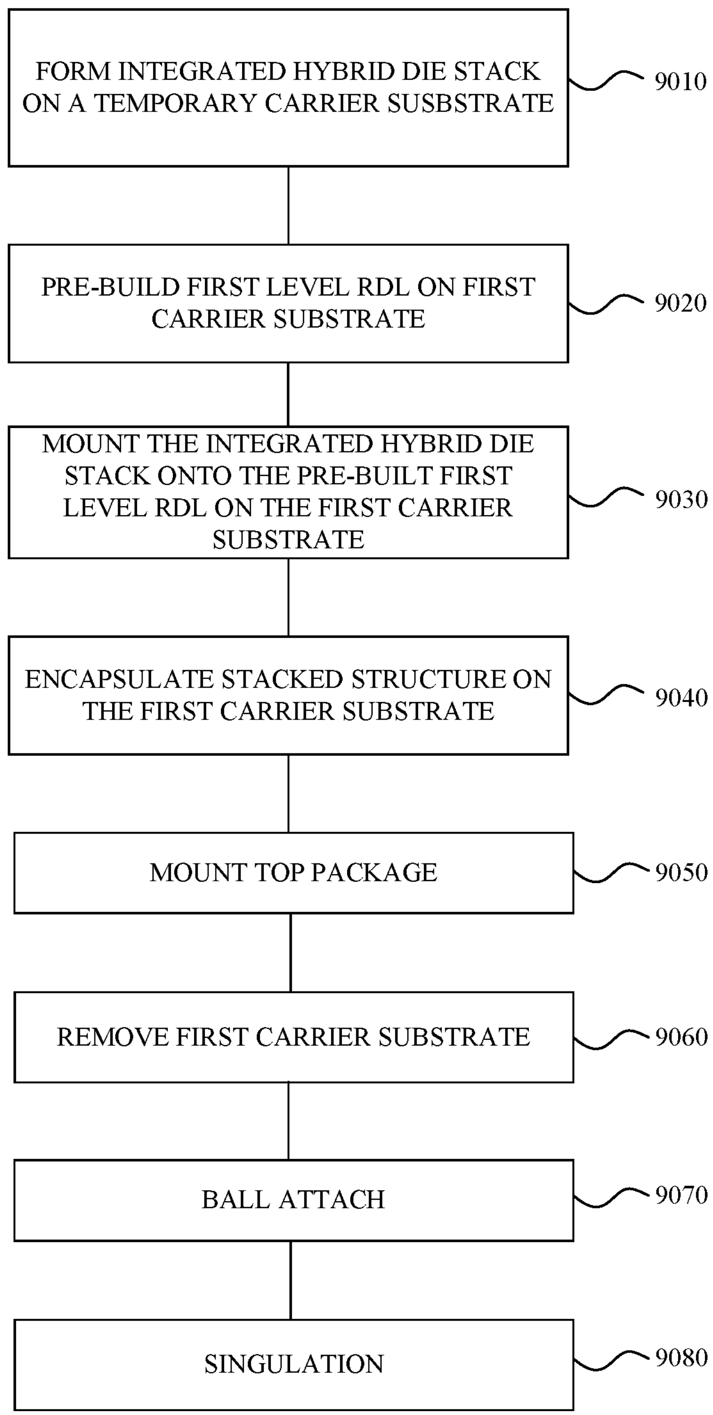
FIG. 9 is a flow chart illustrating a process of forming a package on package structure including a top NAND package of FIG. 8 in accordance with an embodiment.

FIG. 9 is a flow chart illustrating a process of forming a package on package structure including a top NAND package of FIG. 8 in accordance with an embodiment. In interests of clarity, the process illustrated in FIG. 9 is described concurrently with the schematic cross-sectional side view illustrations of FIGS. 9A-9D and FIG. 8.

Figure 9A:
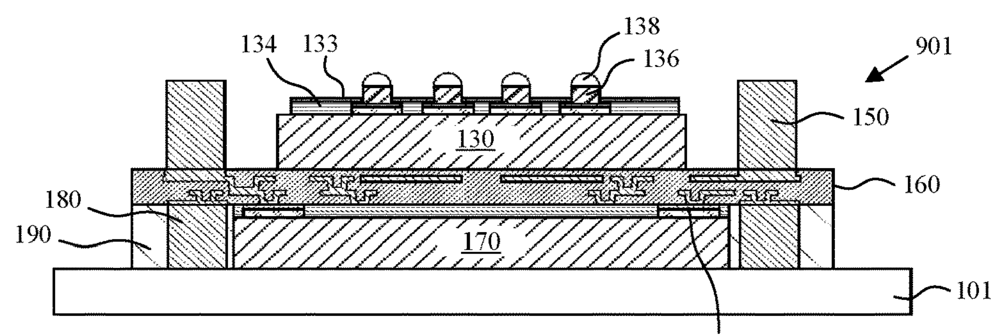
FIGS. 9A-9D are schematic cross-sectional side view illustrations of a process of forming the package on package structure of FIG. 8 in accordance with an embodiment.

Referring to FIG. 9A, at operation 9010 an integrated hybrid die stack 901 including stacked first die 130 and second die 170 is formed on a temporary carrier substrate 101. Such a structure may be formed at the wafer or panel level. In an embodiment, a second plurality of conductive pillars 180 is formed on the temporary carrier substrate 101, followed by attaching a plurality of second die 170 face up on the temporary carrier substrate 101, for example, with die attach films. The plurality of second die 170 and the second plurality of conductive pillars 180 are then encapsulated in a second level molding compound 190, followed by processing to expose the second plurality of conductive pillars 180 and metallic contacts 175 of the plurality of second die 170. A second level RDL 160 is then formed directly on the second level molding compound 190, the second plurality of conductive pillars 180 and the metallic contacts 175 of the plurality of second die 170. A first plurality of conductive pillars 150 are then formed on the second level RDL 160, followed by attaching a plurality of first die 130 face up on the second level RDL 160, for example, with die attach films resulting in an integrated hybrid die stack 901. As shown, the bottom side 133 of the first die 130 may include a plurality of contacts 136 (e.g. contact pads, or studs), a passivation layer 134, and a plurality of solder bumps 138 attached to the plurality of contacts 136.

Figure 9B:
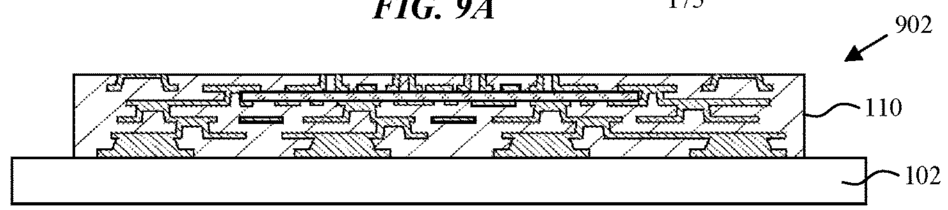

Referring to FIG. 9B, at operation 9020, in a separate process a first level RDL 110 is pre-built onto a first carrier substrate 102, resulting in a pre-built RDL carrier 902.

Figure 9C:
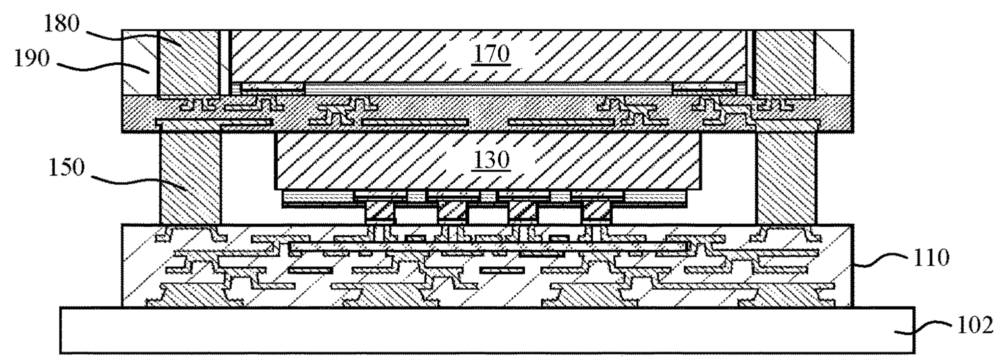

At operation 9030 the integrated hybrid die stack 901 is stacked onto the pre-built RDL carrier 902, as illustrated in FIG. 9C. While the pre-built RDL carrier 902 remains at the first carrier substrate 102 level, the integrated hybrid die stack 901 may be stacked either at the temporary carrier substrate 101 level, or as individual die stacks. Thus, a plurality of individual die stacks including the first die 130 and second die 170 can be removed from the temporary carrier substrate 101, singulated, and mounted onto the pre-built RDL carrier 902, resulting in the structure illustrated in FIG. 9C. Alternatively, stacking may be performed at the wafer/panel level followed by removal of the temporary carrier substrate 101, resulting in the structure illustrated in FIG. 9C.

The stacked structure, not including the temporary carrier substrate 101, may then be encapsulated with a first level molding compound 140 on the first carrier substrate 102 at operation 9040. In accordance with embodiments, the first level molding compound 140 laterally surrounds the first plurality of conductive pillars 150, the first die 130, and may encroach underneath the first die 130 between the first die 130 and the first level RDL 110. In accordance with embodiments in which operation 9030 is performed with singulated stacked die, the first level molding compound 140 may optionally laterally surround the second level molding compound 190 at operation 9040.

Figure 9D:
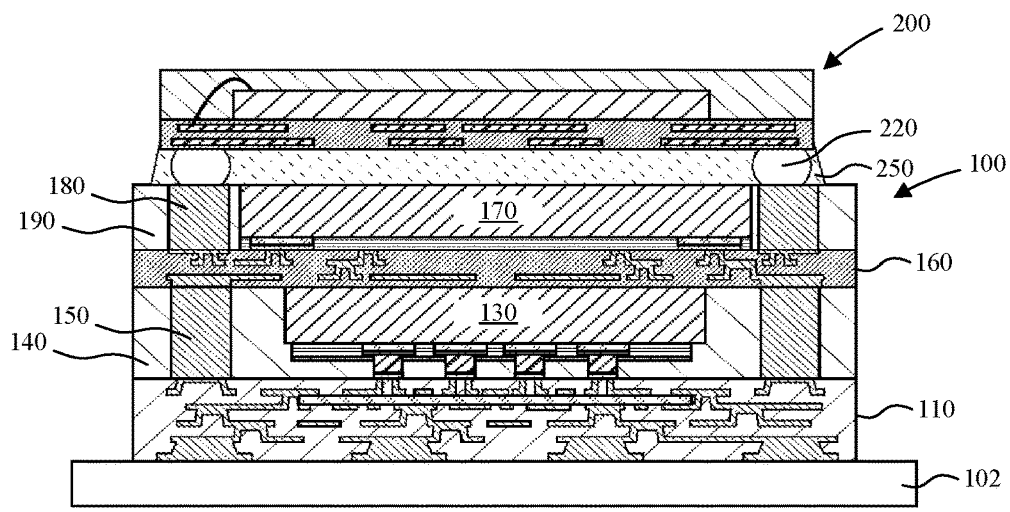

Referring now to FIG. 9D, a plurality of top packages 200 are mounted on a corresponding plurality of areas of the reconstituted structure that will become the plurality of bottom packages 100 at operation 9050. Mounting may be performed using a suitable technique such as flip chip, with package solder bumps 220 used to bond the top packages 200 to the second plurality of conductive pillars 180. Following the bonding of the top packages 200 with package solder bumps 220, an underfill material 250 can be applied between the bottom package 100 areas and the top package 200, with the underfill material 250 laterally surrounding the package solder bumps 220.

Referring now to FIG. 8, and operations 9060, 9070 the first carrier substrate 102 may then be removed, followed by attaching solder bumps 120 to the UBM pads 118 of the first level RDL 110. Individual package on package structures 300 may then be singulated from the reconstituted structure at operation 9080. Still referring to FIG. 8, the top package 200 includes a third die 230. In an embodiment the third die 230 is a NAND die. In an embodiment, the second die 170 is a DRAM die. The top package 200 may have a variety of configurations in accordance with embodiments. For example, the top package 200 may include a top package RDL 210, with the third die 230 attached to the top package RDL 210. The top package RDL 210 may be a wiring layer, or may be formed similarly as the first or second level RDLs. The top package RDL 210 may include one or more redistribution lines 212 and dielectric layers 214. In an embodiment, the third die 230 is attached to a top side 211 the top package RDL 210 with a die attach film, and electrically connected to the top package RDL 210 with a wire bond 260. The underfill material 250 may be formed in the space below the bottom side 213 of the top package RDL 210.

In accordance with embodiments, the packaging process and resulting structure of the PoP structure 300 illustrated in FIG. 8 does not require lateral circuit board space for routing between adjacent die, and allows the ability to integrate fully tested NAND die packages with known good DRAM die. Furthermore, the first level RDL 110 can be pre-built prior to availability of the first die 130 and second die 170.

In utilizing the various aspects of the embodiments, it would become apparent to one skilled in the art that combinations or variations of the above embodiments are possible for forming a package on package structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package on package structure comprising:
- a bottom package comprising:
  - a first level redistribution layer (RDL);
  - a first die attached to a top side of the first level RDL with a first plurality of solder bumps;
  - a first level molding compound encapsulating the first die on the top side of the first level RDL;
  - a second level RDL over the first die and the first level molding compound;
  - a second die attached to a top side of the second level RDL with a second plurality of solder bumps; and
  - a second level molding compound encapsulating the second die on the top side of the second level RDL, wherein a top side of the second level molding compound and a top side of the second die form a planar surface;
- a top package mounted on the bottom package with a plurality of package solder bumps; and
- an underfill material located between the bottom package and the top package, and laterally surrounding the plurality of package solder bumps, wherein the underfill material is formed directly on the top side of the second die.

2. The package on package structure of claim 1, further comprising a first plurality of conductive pillars extending from the top side of the first level RDL to a bottom side of the second level RDL.

3. The package on package structure of claim 1, further comprising a second plurality of conductive pillars extending from the top side of the second level RDL and through the second level molding compound.

4. The package on package structure of claim 3, wherein the plurality of package solder bumps is bonded to the second plurality of conductive pillars.

5. The package on package structure of claim 1, wherein the second level RDL is formed directly on a top side of the first die and a top side the first level molding compound.

6. The package on package structure of claim 1, wherein the top package comprises a NAND die, and the second die is a DRAM die.

7. A package on package structure comprising:
- a bottom package comprising:
  - a first level redistribution layer (RDL);
  - a first die on a top side of the first level RDL, wherein the first level RDL is formed directly on a metallic contact along a bottom side of the first die; and
  - a first level molding compound encapsulating the first die on the top side of the first level RDL; and
- a top package mounted on the bottom package with a plurality of package solder bumps, wherein the top package comprises:
  - a top package RDL;
  - a second die attached to a bottom side of the top package RDL;
  - a lower molding compound encapsulating the second die on the bottom side of the top package RDL;
  - a third die attached to a top side of the top package RDL; and
  - a top package molding compound encapsulating the third die on the top side of the top package RDL;
  - wherein the plurality of package solder bumps extend through the lower molding compound.

8. The package on package structure of claim 7, further comprising a first plurality of conductive pillars extending from the top side of the first level RDL and through the first level molding compound.

9. The package on package structure of claim 8, wherein the plurality of package solder bumps is bonded to the first plurality of conductive pillars, and the plurality of package solder bumps extend from the bottom side of the top package RDL to the first plurality of conductive pillars.

10. The package on package structure of claim 7, further comprising an underfill material located between the bottom package and the top package, and laterally surrounding the plurality of package solder bumps.

11. The package on package structure of claim 7, wherein the second die is bonded to the top package RDL with solder bumps.

12. The package on package structure of claim 7, wherein the second die is wire bonded to the top package RDL.

13. The package on package structure of claim 7, wherein the second die is a DRAM die, and the third die is a NAND die.

14. A package on package structure comprising:
- a bottom package comprising:
  - a first level redistribution layer (RDL);
  - a first die on a top side of the first level RDL, wherein the first level RDL is formed directly on a metallic contact along a bottom side of the first die;
  - a first level molding compound encapsulating the first die on the top side of the first level RDL; and
  - a second level RDL over the first die and the first level molding compound, wherein a top side of the first die is directly attached to a bottom side of the second level RDL with an adhesive layer;
- a second die mounted on a top side of the second level RDL; and
- a top package mounted on the bottom package with a plurality of package solder bumps, wherein the plurality of package solder bumps surround the second die, wherein the top package comprises:
  - a top package RDL;
  - a third die attached to a top side of the top package RDL; and
  - a top package molding compound encapsulating the third die on the top side of the top package RDL.

15. The package on package structure of claim 14, further comprising a first plurality of conductive pillars extending from the top side of the first level RDL to the bottom side of the second level RDL.

16. The package on package structure of claim 15, wherein the plurality of package solder bumps is bonded to the first plurality of conductive pillars.

17. The package on package structure of claim 14, further comprising an underfill material located between the bottom package and the top package, and laterally surrounding the plurality of package solder bumps and the second die.

18. The package on package structure of claim 14, further comprising a third molding compound encapsulating the top package, the plurality of package solder bumps, and the second die on the top side of the second level RDL.

19. The package on package structure of claim 14, wherein the second die is a DRAM die, and third die is a NAND die.

* * * * *